(12) United States Patent
Mori et al.

(10) Patent No.: US 6,566,937 B1
(45) Date of Patent: May 20, 2003

(54) FUSE CIRCUIT

(75) Inventors: Katsuhiro Mori, Kawasaki (JP); Shinya Fujioka, Kawasaki (JP); Masahiro Niimi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/152,579

(22) Filed: May 23, 2002

(30) Foreign Application Priority Data

Nov. 20, 2001 (JP) ........................................ 2001-354402

(51) Int. Cl.[7] .............................................. H01H 37/76
(52) U.S. Cl. ...................... 327/525; 327/526; 365/225.7
(58) Field of Search ................................. 327/525, 526; 365/200, 96, 225.7

(56) References Cited

U.S. PATENT DOCUMENTS 6,320,802 B1 * 11/2001 Ohbayashi .................. 365/200
6,489,832 B1 * 12/2002 Kim et al. ................... 327/525

* cited by examiner

Primary Examiner—Terry D. Cunningham
Assistant Examiner—Quan Tra
(74) Attorney, Agent, or Firm—Arent Fox Kintner Plotkin & Kahn, PLLC

(57) ABSTRACT

Upon receiving a level of a second node through a third switch in the first half of a first period, a holding circuit outputs it as a fuse signal indicating a blown-out state of a fuse. Since the third switch turns off in the second half of the first period, a change in level of the second node occurring thereafter will not affect data in the holding circuit, whereby prevents malfunction of a fuse circuit. With the fuse blown, a level of a first node gets fixed at that of a second power supply line after the first period. This eliminates a voltage difference between both ends of the fuse, thereby preventing a growback. No occurrence of growback makes just one fuse blowing sufficient for the fuse circuit even with the fuse not completely cut off. This consequently shortens a time for blowing the fuse in a test process.

4 Claims, 4 Drawing Sheets

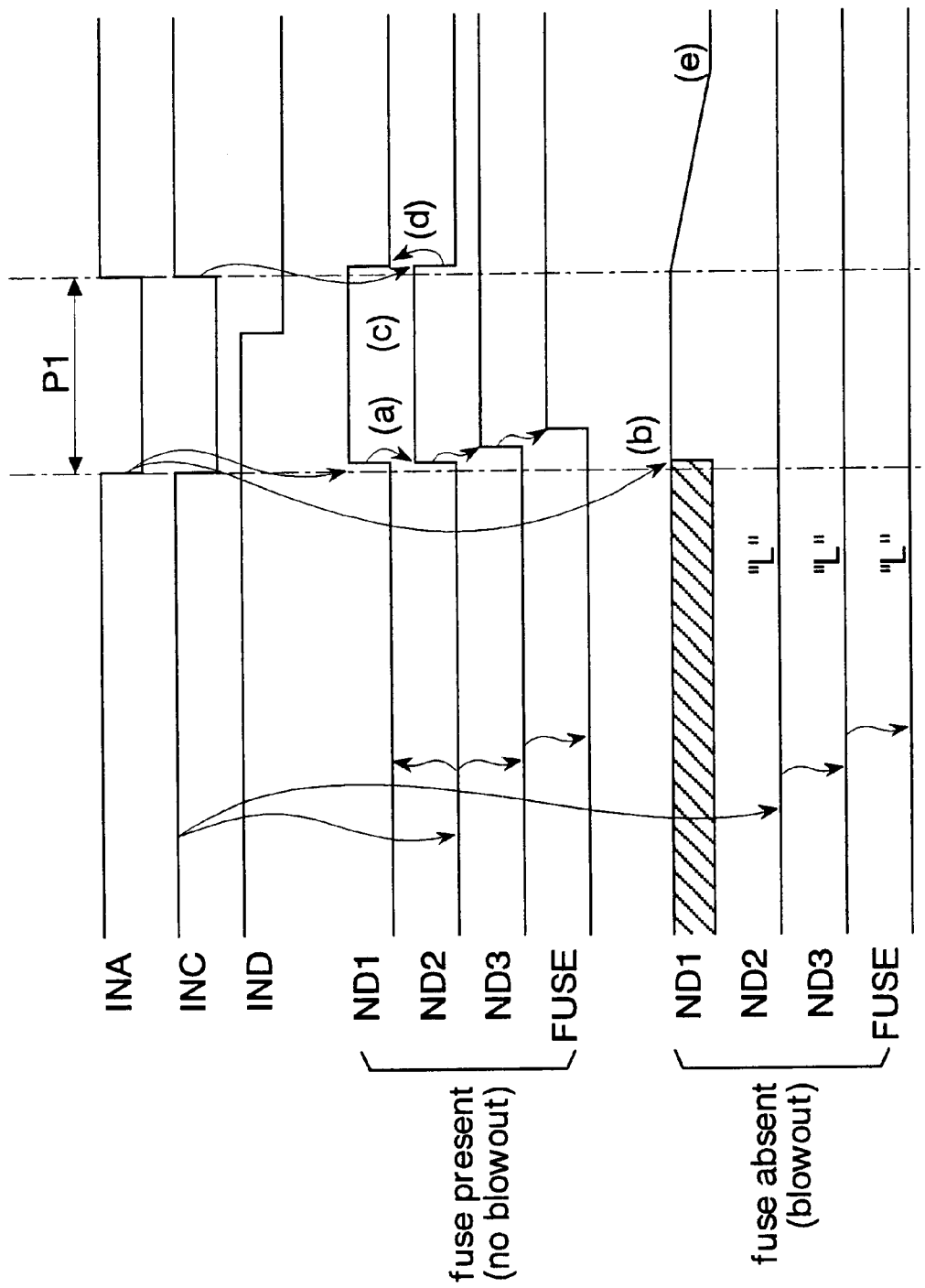

FUSE CIRCUIT

BACKGROUND OF THE INVENTION

1. Field of the Invention

The present invention relates to a fuse circuit formed in a semiconductor integrated circuit.

2. Description of the Related Art

A semiconductor integrated circuit generally has a redundancy circuit for relieving a lattice defect in a substrate and a defect caused in a fabrication process. For example, in a semiconductor memory such as DRAM, a redundancy memory cell array is formed in addition to regular memory cell arrays. The semiconductor memory having the redundancy memory cell array includes a plurality of fuse circuits for storing respective bits of addresses indicating the memory cell arrays. Polysilicon has been used conventionally as a material of a fuse which makes up the fuse circuit, but metal such as aluminum or copper is often used in recent years.

When a memory cell array is defective, the fuse of a predetermined fuse circuit is blown (programmed) according to the address of the defective memory cell array in a test process. The fuse is blown by, for example, laser irradiation.

The fuse circuit of this kind outputs a fuse signal indicating a blown-out state of the fuse when the power of the semiconductor memory turns on. Then, the semiconductor memory disables the defective memory cell array according to the state of the fuse circuit, and enables the redundancy memory cell array instead. Namely, the defective memory cell is relieved. Thus, the defective memory cell is relieved according to the address programmed in the fuse circuit, thereby improving yield.

It should be mentioned that it is hard to blow the fuse formed of metal as compared with the fuse formed of polysilicon. For this reason, there may be the case where the fuse formed of metal is not cut off completely by a single laser irradiation. Even though the fuse is not cut off completely, it is determined that the fuse is blown when a resistance value of the fuse exceeds a predetermined value. Hence, the fuse circuit operates normally.

When the fuse is formed of metal, however, a growback phenomenon, occurs due to a voltage difference between both ends of the fuse, if the fuse is not cut off completely. The growback phenomenon means that the resistance value of the fuse decreases gradually due to electromigraion and the like.

When the resistance value of the fuse decreases to be equal to or smaller than the predetermined value due to the growback, the fuse circuit determines that the fuse is not blown and outputs the fuse signal. Hence, when the phenomenon like the above occurs, the defective memory cell array is not relieved properly and a malfunction occurs in the above-described semiconductor memory.

In order to prevent the growback, the fuse circuit, in which the fuse is formed of metal, conventionally cuts the fuse completely off by, for example, carrying out blowout processing twice. However, the semiconductor memory such as the DRAM has a larger number of the fuses as compared with a logic LSI and the like. For this reason, there is a disadvantage that performing the blowout processing twice increases processing time in the test process.

SUMMARY OF THE INVENTION

It is an object of the present invention to provide a fuse circuit whose characteristics will not change even in long-term use.

It is another object of the present invention to shorten a time for blowing out a fuse of the fuse circuit.

According to one of the aspects of the fuse circuit of the present invention, a fuse is connected between a first node and a second node. A first switch is connected between the first node and a first power supply line. A second switch is connected between the second node and a second power supply line. A load element is connected between the first node and the second power supply line. A third switch is connected between the second node and a third node. A holding circuit is connected to the third node. The holding circuit holds a level of the third node and outputs the held level as a fuse signal indicating a blown-out state of the fuse.

The first switch turns on during a first period to connect the first node to the first power supply line. The second switch turns on before and after the first period and turns off during the first period. The third switch turns on in the first half of the first period and turns off in the second half of the first period. A level of the second node is transmitted to the third node during an period of the third switch.

In the case where the fuse is not blown, the level of the second node turns to that of the first power supply line by the turning-on of the first switch. Since the third switch has turned on in the first half of the first period, the level of the second node is transmitted to the third node. The holding circuit holds the level of the first power supply line (indicating that the fuse is not blown), and outputs the held level as the fuse signal.

The third switch turns off in the second half of the first period. After completion of the first period, the levels of the first node and the second node get fixed at a level of the second power supply line by a current flowing through the load element or the turning-on of the second switch. At this point the third switch is off, and hence it is possible to prevent a short circuit between the second node (voltage of the second power supply line) and the third node (voltage of the first power supply line). This consequently prevents data (level) destruction in the holding circuit, and a malfunction of the fuse circuit.

Meanwhile, in the case where the fuse is blown, the level of the first node is not transmitted to the second node even if the first switch turns on. Hence, the level of the second node is kept at the level of the second power supply line. Since the third switch turns on in the first half of the first period, the level of the second node is transmitted to the third node. The holding circuit holds the level of the second power supply line (indicating that the fuse is blown), and outputs the held level as the fuse signal. Thereafter, the second switch turns on, whereby the level of the second node gets fixed at the level of the second power supply line. Further, the level of the first node gets fixed at the level of the second power supply line by the current flowing through the load element.

Thus, a voltage difference between both ends of the fuse (the first and second nodes) becomes 0 V after the completion of the first period (after the holding circuit's holding the levels), regardless of whether or not the fuse is blown. Therefore, it is possible to prevent the occurrence of the growback due to electromigration and the like and to prevent gradual decrease in a resistance value of the fuse, even when the blown fuse is not completely cut off. In other words, characteristics of the fuse circuit will not be deteriorated even in long-term use. This makes it possible to prevent the fuse circuit from erroneously outputting fuse signals, and to prevent the malfunction of a semiconductor integrated circuit in which the fuse circuit is formed.

The growback does not occur even when the fuse is not cut off completely so that just one fuse blowing out is sufficient for the fuse circuit. This can consequently shorten the time for blowing out the fuses in a test process and the like.

According to another aspect of the fuse circuit of the present invention, applying the present invention to the fuse circuit having a fuse formed of metal enables secure prevention of the occurrence of the growback due to electromigration and the like even if the blown fuse is not cut off completely.

According to another aspect of the fuse circuit of the present invention, the load element is formed as a load transistor to turn on after the first period. Since the load element is formed with the transistor, the level of the first node can be changed to that of the second power supply line at desired timing after the first period. As a result of this, the voltage difference between both ends of the fuse can quickly become 0 V after the completion of the first period.

According to another aspect of the fuse circuit of the present invention, the load element is formed as a resistor. Forming the load element with the resistor allows the level of the first node to turn to the level of the second power supply line without using a control signal. As a result, a number of signal lines can be reduced.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 4 is a timing chart showing the operation of the fuse circuit of the second embodiment.

DESCRIPTION OF THE PREFERRED EMBODIMENTS

Hereinafter, embodiments of the present invention will be explained with reference to the drawings.

Figure 1:
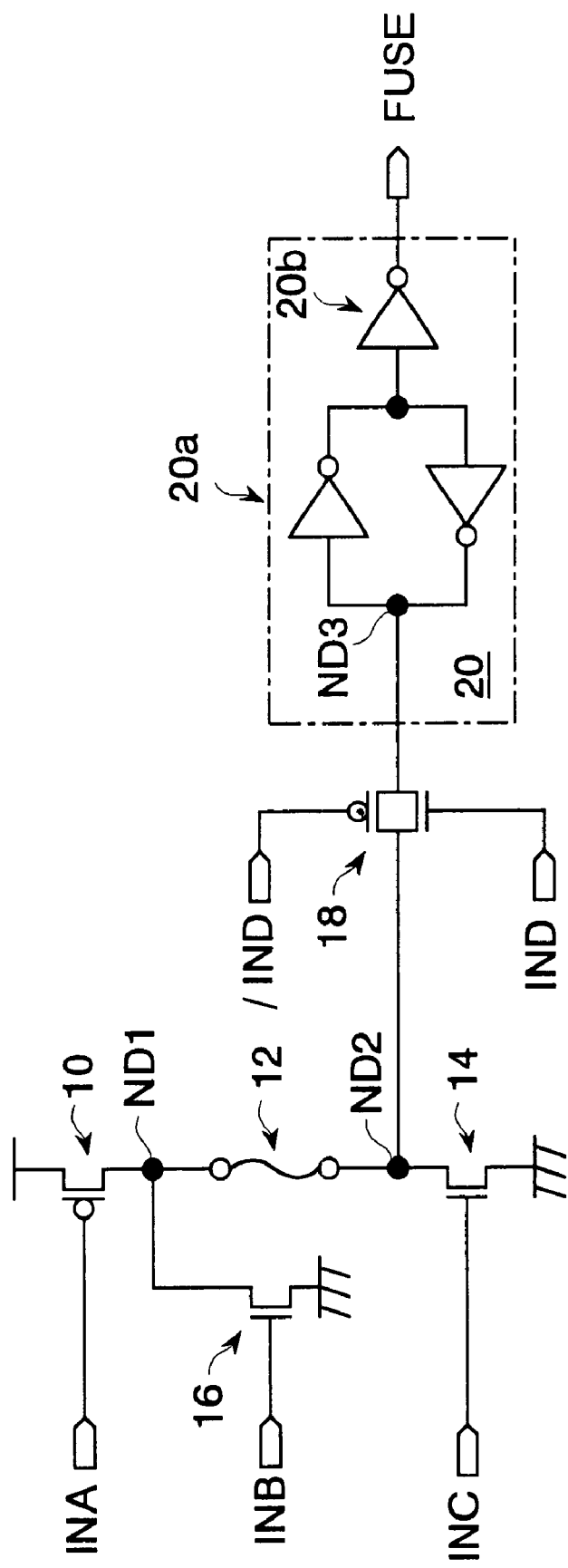
FIG. 1 is a circuit diagram showing a first embodiment of a fuse circuit according to the present invention.

FIG. 1 shows a first embodiment of a fuse circuit according to the present invention. A plurality of the fuse circuits are formed in DRAM. Each of these fuse circuits stores respective bits of an address of a memory cell array including a defective memory cell. Based on the information stored in the fuse circuit, a redundancy memory cell array is selected instead of the defective memory cell array.

The fuse circuit includes a pMOS transistor 10 (first switch), a fuse 12 made of aluminum, an nMOS transistor 14 (second switch), an nMOS transistor 16 (load transistor), a CMOS transmission gate 18 (third switch) and a holding circuit 20.

The pMOS transistor 10, the fuse 12 and the nMOS transistor 14 are connected in series between a power supply line VDD (first power supply line) and a ground line VSS (second power supply line). A gate of the PMOS transistor 10 receives an input signal INA. A gate of the nMOS transistor 14 receives an input signal INC. The nMOS transistor 16 is connected between a node ND1 (first node) which connects the PMOS transistor 10 and the fuse 12 and the ground line VSS. A gate of the nMOS transistor 16 receives an input signal INB. The input signals INA, INB, INC, IND and /IND are generated by a power-on reset circuit (not shown) being formed in the DRAM and operating when the power turns on.

The CMOS transmission gate 18 and the holding circuit 20 are connected in series between a node ND2 (second node) which connects the fuse 12 and the nMOS transistor 14 and an output terminal FUSE. The CMOS transmission gate 18 turns on when the input signals IND and /IND, which are complementary to each other, are at a high level and at a low level, respectively, to connect the node ND2 to an input (node ND3) of the holding circuit 20. The holding circuit 20 includes a latch 20a which latches a level of the node ND3 and a buffer 20b (inverter). The buffer 20b inverts an output of the latch 20a, and outputs the inverted level as a fuse signal FUSE indicating a blown-out state of the fuse 12.

Figure 2:
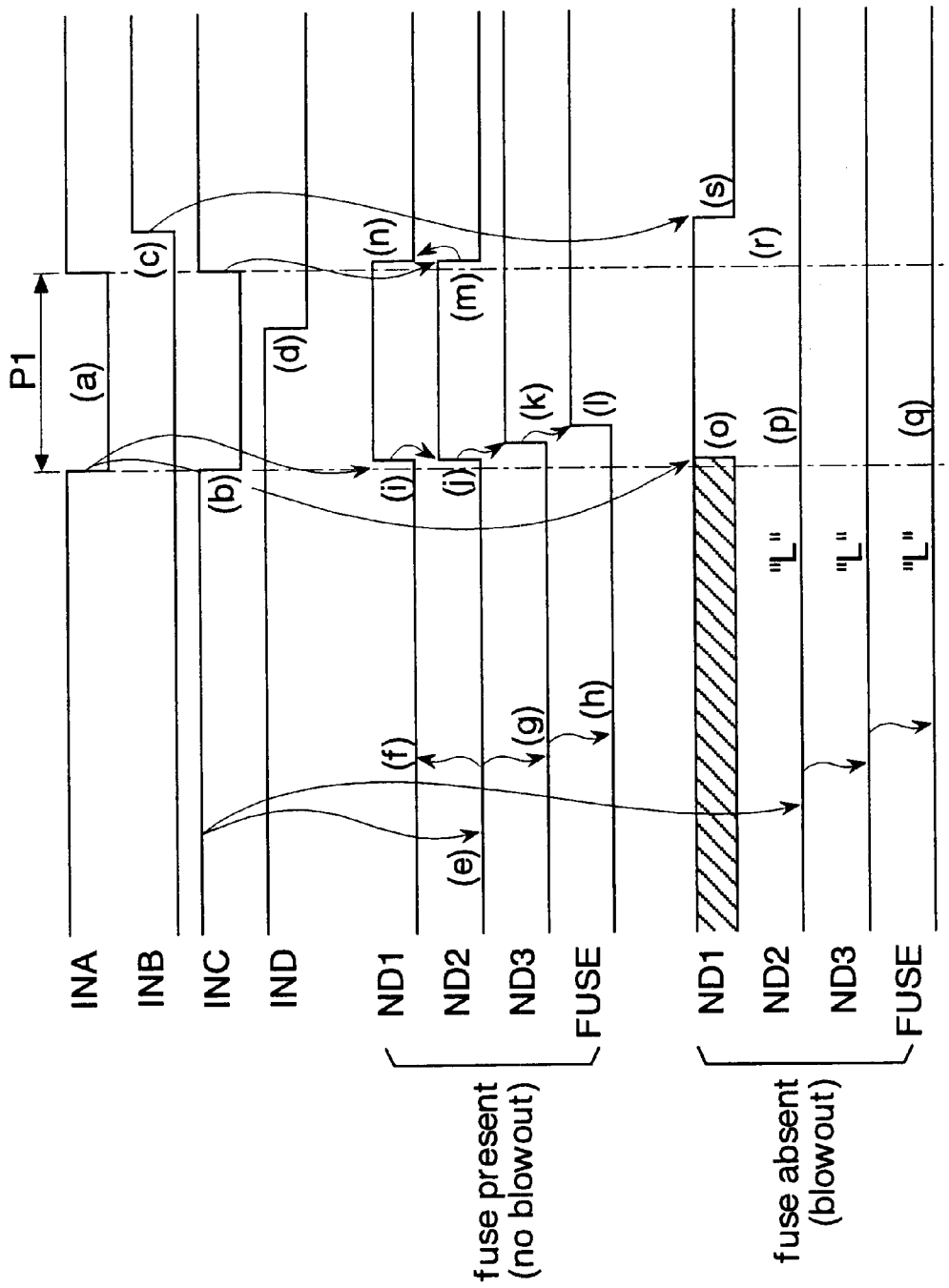
FIG. 2 is a timing chart showing the operation of the fuse circuit of the first embodiment.

FIG. 2 shows the operation of the fuse circuit according to the first embodiment. In this example, when the power of the DRAM turns on, the power-on reset circuit operates to output the input signals INA, INB, INC, IND and /IND. The input signals INA and INC change to the low level only during a first period P1 after the power turns on (FIG. 2(a) and (b)). The input signal INB changes from the low level to the high level after the first period P1 (FIG. 2(c)). The input signals IND and /IND change from the high level to the low level during the first period P1 (FIG. 2(d)).

Immediately after the power turns on, the input signals INA, INB, INC and IND are at the high level, low level, high level and high level, respectively. Hence,the pMOS transistor 10, the nMOS transistors 14 and 16 and the CMOS transmission gate 18 turn off, on, off and on, respectively. Since the nMOS transistor 14 is on, the node ND2 is kept at the low level (FIG. 2(e)).

First, the operation in the case where the fuse 12 is not blown will be explained. Since the fuse 12 is not blown, the node ND1 changes to the low level when the nMOS transistor 14 turns on (FIG. 2(f)). The node ND3 changes to the low level when the CMOS transmission gate 1 8 turns on (FIG. 2(g)). The latch 20a of the holding circuit 20 latches the level of the node ND3, and inverts the latched level. The buffer 20b further inverts the output of the latch 20a, and outputs it as the fuse signal FUSE at the low level (FIG. 2(h)).

Next, in response to the input signals INA and INC's turning to the low level, the pMOS transistor 10 turns on and the nMOS transistor 14 turns off. Due to these operations, the node ND1 changes to the high level (FIG. 2(i)). Since the fuse 12 is not blown, the node ND2 changes to the high level (FIG. 2(j)). Further, since the CMOS transmission gate 18 is on, the level of the node ND2 is transmitted to the node ND3 (FIG. 2(k)). The latch 20a inverts the level of the node ND3 and the buffer 20b changes the fuse signal FUSE from the low level to the high level (the level indicating that the fuse 12 is not blown) (FIG. 2(l)).

The CMOS transmission gate 18 turns off in synchronization with the input signal IND's turning to the low level. Even though the level of the node ND2 changes after that, the level held in the holding circuit 20 does not change.

Next, in response to the input signals INA and INC's turning to the high level, the pMOS transistor 10 turns off and the nMOS transistor 14 turns on. Due to these operations, the nodes ND1 and ND2 change to the low level (FIG. 2(m) and (n)). At this time, since the CMOS transmission gate 18 is off, the high level of the node ND3 which is held in the holding circuit 20 is not transmitted to the node ND2. Namely, it is possible to prevent a collision between the low level of the node ND2 and the high level of the node ND3 and to prevent a malfunction of the fuse circuit.

Next, in response to the input signal INB's turning to the high level, the nMOS transistor 16 turns on. The nMOS transistor 14 is already on, and therefore the levels of the nodes ND1 and ND2 do not change.

Meanwhile, in the case where the fuse 12 is blown, the pMOS transistor 10 and the nMOS transistor 16 have turned off before the first period P1, and hence the node ND1 is at the high level or at the low level. The levels of the nodes ND2 and ND3 and the fuse signal FUSE are the same as those when the fuse 12 is not blown.

Next, in response to the input signals INA and INC'S turning to the low level, the pMOS transistor 10 turns on and the nMOS transistor 14 turns off. Due to these operations, the node ND1 changes to the high level (FIG. 2(o)). Since the fuse 12 is blown, the level of the node ND1 is not transmitted to the node ND2. Therefore, the node ND2 keeps the low level (FIG. 2(p)).

Since the CMOS transmission gate 18 is on, the low level of the node ND2 is latched by the latch 20a through the node ND3. Hence, the level of the fuse signal FUSE does not change (FIG. 2(q)). The CMOS transmission gate 18 turns off in the second half of the first period P1.

Next, in response to the input signals INA and INC's turning to the high level, the PMOS transistor 10 turns off and the nMOS transistor 14 turns on. The node ND2 is already at the low level, and therefore the levels of the nodes ND1 and ND2 do not change (FIG. 2(r)).

Next, in response to the input signal INB's turning to the high level, the nMOS transistor 16 turns on. The level of the node ND1 changes to the low level by the turning-on of the nMOS transistor 16 (FIG. 2(s)). Thereafter, the input signal INB is kept at the high level and a voltage difference between both ends of the fuse 12 is always 0 V, as long as a power supply voltage is supplied to the DRAM. Therefore, even when the fuse 12 is not cut off completely and operates as a high resistance, a growback due to electromigration and the like does not occur. As a result of this, even when the power is repeatedly turned on many times in long use of the DRAM, the level of the fuse signal FUSE which is outputted from the fuse circuit does not change, and a malfunction of the DRAM can be prevented.

As described above, according to the present invention, the CMOS transmission gate 18 is turned off in the second half of the first period P1. Hence, when the fuse 12 is not blown, it is possible to prevent a short circuit between the node ND2 and the node ND3 after the completion of the first period P1. Therefore, it is possible to prevent the malfunction of the fuse circuit.

After the holding circuit 20 holds the information indicating the blown-out state of the fuse 12 (after the completion of the period P1), the nMOS transistor 16 is turned on, thereby allowing the voltage difference between both ends of the fuse 12 to become 0 V. Therefore, it is possible to prevent the occurrence of the growback and to prevent a resistance value of the fuse 12 from decreasing gradually, even when the blown fuse is not cut completely. As a result of this, it is possible to prevent the fuse circuit from outputting an improper fuse signal FUSE, and to prevent the malfunction of the DRAM in which the fuse circuit is formed. The application of the present invention is highly effective especially when the fuse 12 is formed of metal such as aluminum which easily causes the growback.

Since the occurrence of the growback can be prevented even when the fuse 12 formed of metal is not cut completely, only one blowout is necessary for each fuse 12 in a test process of the DRAM. As a result of this, it is possible to shorten a time for blowing out the fuses 12 in the test process and the like.

Since the node ND1 and the ground line VSS are connected through the nMOS transistor 16, it is possible to ground the node ND1 at desired timing after the first period P1. As a result of this, it is possible to allow the voltage difference between both ends of the fuse 12 to become 0 V speedily after the completion of the first period P1.

Figure 3:
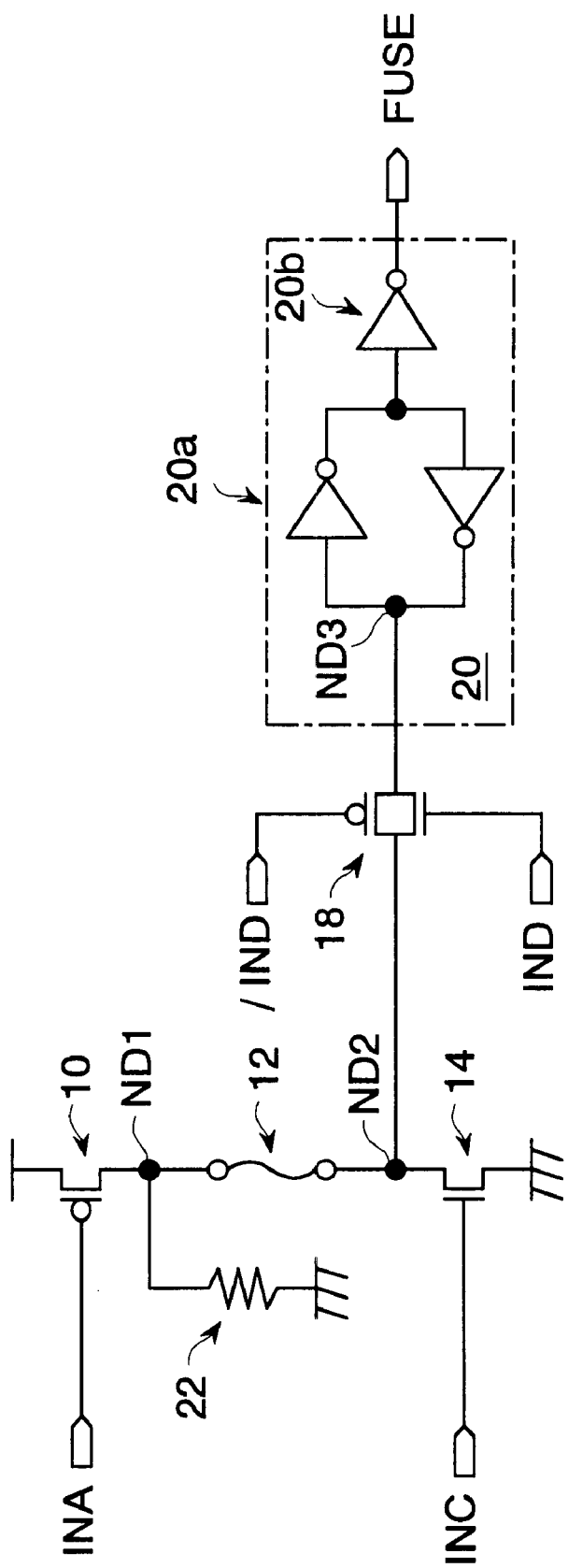
FIG. 3 is a circuit diagram showing a second embodiment of a fuse circuit according to the present invention.

FIG. 3 shows a second embodiment of the fuse circuit according to the present invention. The same numerals and symbols are given to designate the same elements as those of the first embodiment, and detailed explanations thereof will be omitted.

According to this embodiment, a resistor 22 whose resistance value is high is arranged instead of the nMOS transistor 16 shown in FIG. 1. Namely, the resistor 22 is connected between a node ND1 and a ground line VSS. The input signal INB of the first embodiment is not generated. The resistor 22 is formed by using, for example, resistance of a diffusion layer (diffusion resistance). The rest of the structure is the same as that of the first embodiment.

FIG. 4 shows the operation of the fuse circuit according to the second embodiment. Detailed explanations about the same operations as those of the above-described first embodiment will be omitted. When the power of DRAM turns on, a power-on reset circuit operates to output input signals INA, INC, IND and /IND in this example as well. In response to the input signal INA's turning to the low level, the level of the node ND1 changes to the high level (FIG. 4(a) and (b)).

In the case where a fuse 12 is not blown, a pMOS transistor 10 turns on during a first period P1, and hence voltages of the nodes ND1 and ND2 are kept at the high level (FIG. 4(c)). Thereafter, in response to the input signal INC's turning to the high level the levels of the nodes ND1 and ND2 change to the low level (FIG. 4(d)). Therefore, similarly to the first embodiment, it is possible to prevent a collision between the low level of the node ND2 and the high level of the node ND3 and to prevent a malfunction of the fuse circuit.

Meanwhile, in the case where the fuse 12 is blown, the level of the node ND2 is not transmitted to the node ND1, and hence the level of the node ND1 gradually changes to the low level through the resistor 22, after the first period P1 (FIG. 4(e)). As a result of this, a voltage difference at both ends of the fuse 12 is always 0 V. Therefore, similarly to the first embodiment, even when the fuse 12 is not cut off completely and operates as a high resistance, a growback due to electromigration and the like does not occur. As a result of this, the level of a fuse signal FUSE which is outputted from the fuse circuit does not change, and a malfunction of the DRAM can be prevented.

The same effects as those of the above-described first embodiment can be obtained in this embodiment as well. Further, according to this embodiment, a load element for grounding the node ND1 is formed with the resistor 22, and therefore, it is not necessary to use a control signal (the input signal INB according to the first embodiment). As a result of this, it is possible to reduce a number of signal lines.

Incidentally, in the above embodiments, the example of forming the fuse with aluminum is explained. The present invention is not limited to the above embodiments. For example, the same effects can be obtained even when the fuse is formed with another metal such as copper or the like.

The invention is not limited to the above embodiments and various modifications may be made without departing from the spirit and the scope of the invention. Any, improvement may be made in part or all of the components.

What is claimed is:

1. A fuse circuit comprising:

a fuse for connecting a first node and a second node;

a first switch being connected between said first node and a first power supply line, or turning on during a first period;

a second switch being connected between said second node and a second power supply line, for turning off during said first period and turning on before and after said first period;

a load element being connected between said first node and said second power supply line, to be conducted at least after said first period;

a third switch being connected between said second node and a third node, for switching from a turned-on state to a turned-off state during said first period; and a holding circuit being connected to said third node, for holding a level of said third node and outputting the held level as a fuse signal indicating a blown-out state of said fuse.

2. The fuse circuit according to claim 1, wherein said fuse is formed of metal.

3. The fuse circuit according to claim 1, wherein said load element is a load transistor to turn on after said first period.

4. The fuse circuit according to claim 1, wherein said load element is a resistor.

* * * * *